(12) United States Patent
Smorenburg et al.

(10) Patent No.: US 10,381,796 B2
(45) Date of Patent: Aug. 13, 2019

(54) FREE ELECTRON LASER

(71) Applicant: ASML Netherlands B.V., Veldhoven (NL)

(72) Inventors: Petrus Wilhelmus Smorenburg, Veldhoven (NL); Johannes Antonius Gerardus Akkermans, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/060,792

(22) PCT Filed: Nov. 29, 2016

(86) PCT No.: PCT/EP2016/079114
§ 371 (c)(1),
(2) Date: Jun. 8, 2018

(87) PCT Pub. No.: WO2017/108348
PCT Pub. Date: Jun. 29, 2017

(65) Prior Publication Data
US 2018/0366899 A1    Dec. 20, 2018

(30) Foreign Application Priority Data

Dec. 23, 2015 (EP) .................... 15202244

(51) Int. Cl.
*H01S 3/09* (2006.01)
*G03F 7/20* (2006.01)
*H05H 7/04* (2006.01)
*H05H 9/04* (2006.01)
*H05H 9/00* (2006.01)

(52) U.S. Cl.
CPC ........ *H01S 3/0903* (2013.01); *G03F 7/70025* (2013.01); *G03F 7/70033* (2013.01);
(Continued)

(58) Field of Classification Search
CPC ............... H01S 3/0903; G03F 7/70025; G03F 7/70033; H05H 7/04; H05H 9/04; H05H 2007/041; H05H 2007/046
See application file for complete search history.

(56) References Cited

U.S. PATENT DOCUMENTS 6,285,690 B1 * 9/2001 Kim ...................... H01S 3/0903
359/335

FOREIGN PATENT DOCUMENTS

WO   WO 2015/135912 A2   9/2015

OTHER PUBLICATIONS

International Search Report and Written Opinion of the International Searching Authority directed to related International Patent Application No. PCT/EP2016/079114, dated Mar. 21, 2017; 12 pages.

(Continued)

*Primary Examiner* — Armando Rodriguez
(74) *Attorney, Agent, or Firm* — Sterne, Kessler, Goldstein & Fox P.L.L.C.

(57) ABSTRACT

A free electron laser FEL comprises an undulator 24 generating coherent EUV radiation receiving an upstream electron beam EB2 and emitting a downstream electron beam EB4 and at least an electron source 21a, 21b operable to produce an upstream electron beam EB1, EB2 comprising bunches of electrons. A beam path is configured to direct the upstream electron beam through: a linear accelerator system (LINAC) comprising at least a first and a second linear accelerators 22a, 22b, a bunch compressor 28b, and said undulator 24. The downstream electron beam EB3, EB4 that leaves the undulator 24 recirculates through the second linear accelerator 22b in parallel with the upstream electron beam with a phase such that the downstream beam is decelerated by the second linear accelerator 22b and then (Continued)

recirculates through the first linear accelerator 22*a* in parallel with the upstream electron beam with a phase such that the downstream beam is decelerated by the first linear accelerator 22*a*; and to direct the downstream beam to a beam dump 100. At least a first energy spreader 50*a*, 50*b*, 50*c* imparts a reversible change to the energy distribution of bunches of electrons and is located at a position in the beam path before the bunch compressor 28*b* and so that it is only passed through by the upstream electron beam EB1. A second energy spreader 50*d* reverses the change to the energy distribution of bunches of electrons imparted by the at least one first energy spreader 50*a*, 50*b*, 50*c*, the second energy spreader 50*d* being located at a position in the beam path before the undulator 24 and so that it is only passed through by the upstream electron beam EB2.

20 Claims, 10 Drawing Sheets

(52) U.S. Cl.
CPC ............... *H05H 7/04* (2013.01); *H05H 9/04* (2013.01); *H05H 9/00* (2013.01); *H05H 2007/041* (2013.01); *H05H 2007/046* (2013.01)

(56) References Cited

OTHER PUBLICATIONS

International Preliminary Report on Patentability directed to related International Patent Application No. PCT/EP2016/079114, dated Jun. 26, 2018; 8 pages.

Emma et al., "A Transverse RF Deflecting Structure for Bunch Length and Phase Space Diagnostics," Stanford Linear Accelerator Center, Aug. 29, 2000; 17 pages.

Stupakov G., "Control and Application of Beam Microbunching in High Brightness Linac-Driven Free Electron Lasers," Stanford Linear Accelerator Center, Proceedings of IPAC2014, Beam Dynamics and Electromagnetic Fields, Jun. 2014; pp. 2789-2793.

Kako et al., "Development of Superconducting Accelerator with ERL for EUV-FEL," KEK High Energy Accelerator Research Organization, Nov. 4, 2014; 20 pages.

Harms et al., "Third Harmonic System at Fermilab*/Flash," Proceedings of SRF2009, Progress Reports and Ongoing Projects, MOOBAU01, 2009, pp. 11-16.

Di Mirtri et al., "Microbunching Instability Suppression via Electron-Magnetic-Phase Mixing," American Physical Society, Physical Review Letters, vol. 112, No. 134802, 2014; pp. 1-5.

Behrens et al., "Reversible electron beam heating for suppression of microbunching instabilities at free-electron lasers," American Physical Society, Physical Review Special Topics—Accelerators and Beams, vol. 15, No. 022802, 2012; pp. 1-10.

Huang et al., "Suppression of microbunching instability in the linac coherent light source," American Physical Society, Physical Review Special Topics—Accelerators and Beams, vol. 7, No. 074401, 2004; pp. 1-10.

Qiang et al., "Suppression of microbunching instability using bending magnets in FEL linacs," Lawrence Berkeley National Laboratory, Jul. 12, 2013; pp. 1-5.

Di Mitri et al., "Suppression of microbunching instability with magnetic bunch length compression in a linac-based free electron laser," American Physical Society, Physical Review Special Topics—Accelerators and Beams, vol. 13, No. 010702, 2010, pp. 1-8.

Cornacchia et al., "Transverse to longitudinal emittance exchange," American Physical Society, Physical Review Special Topics—Accelerators and Beams, vol. 5, No. 084001, 2002; pp. 1-9.

\* cited by examiner

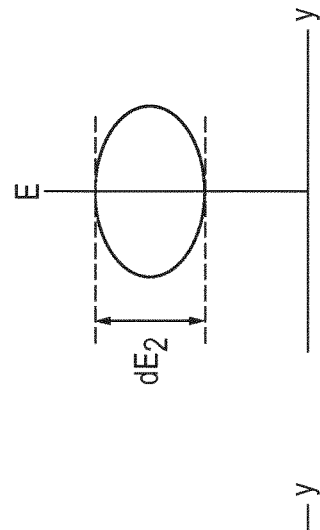
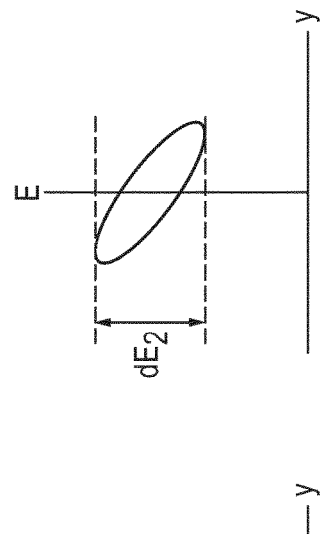
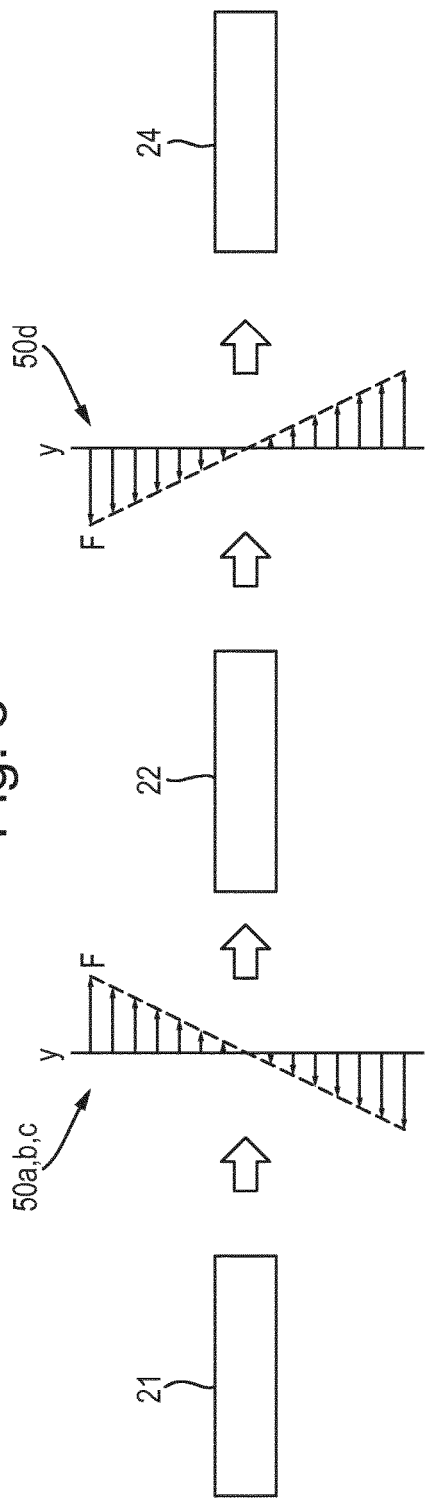

FREE ELECTRON LASER

CROSS-REFERENCE TO RELATED APPLICATIONS

This application claims priority of EP application 15202244.8 which was filed on Dec. 23, 2015 and which is incorporated herein in its entirety by reference.

FIELD

The present invention relates to a free electron laser (FEL). Particularly, but not exclusively, the present invention relates to a FEL suitable for use in a radiation source for a lithographic system.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 5-20 nm, may be used to form smaller features on a substrate than a conventional lithographic apparatus (which may for example use electromagnetic radiation with a wavelength of 193 nm).

It is desirable to produce EUV radiation sources with increased power to increase throughput of EUV lithography.

SUMMARY

According to a first aspect, there is provided a free electron laser comprising:

an electron source operable to produce an upstream electron beam comprising bunches of electrons;

a beam path configured to direct the upstream electron beam through: a linear accelerator system, a bunch compressor, and an undulator so as to generate coherent radiation; to recirculate a downstream beam that leaves the undulator through the linear accelerator in parallel with the upstream electron beam with a phase such that the downstream beam is decelerated by the linear accelerator; and to direct the downstream beam to a beam dump;

a first energy spreader operable to impart a reversible change to the energy distribution of bunches of electrons and located at a position in the beam path before the bunch compressor so that it is only passed through by the upstream electron beam; and a second energy spreader operable to reverse the change to the energy distribution of bunches of electrons imparted by the first beam spreader, the second beam spreader being located at a position in the beam path before the undulator so that it is only passed through by the upstream electron beam.

According to a second aspect, there is provided a lithographic system comprising:
a free electron laser as described above; and
one or more lithographic apparatuses.

According to a third aspect, there is provided a method of producing a radiation beam, comprising:

producing an upstream electron beam comprising bunches of electrons;

accelerating the upstream electron beam through a linear accelerator;

compressing electron bunches of the upstream electron beam;

directing the upstream electron beam through an undulator to generate coherent radiation;

directing a downstream electron beam, that leaves the undulator, through the linear accelerator to form a decelerated electron beam;

reversibly spreading the energy of the bunches of electrons of only the upstream electron beam before the compressing; and reversing the spreading before the undulator.

According a fourth aspect, there is provided a free electron laser comprising:

an electron source operable to produce an upstream electron beam comprising bunches of electrons;

a beam path configured to direct the upstream electron beam through: a linear accelerator system, a bunch compressor, and an undulator so as to generate coherent radiation; to recirculate a downstream beam that leaves the undulator through the linear accelerator in parallel with the upstream electron beam with a phase such that the downstream beam is decelerated by the linear accelerator; and to direct the downstream beam to a beam dump;

a de-chirper configured to remove chirp from bunches of electrons of the upstream beam;

a washout device configured to shift a longitudinal position of electrons in the bunches of electrons of the upstream beam proportionally to their energy;

a chirper configured to add chirp to the bunches of electrons of electrons of the upstream beam; and a compressor configured to compress the bunches of electrons.

According to a fifth aspect, there is provided a method of producing a radiation beam, comprising:

producing an upstream electron beam comprising bunches of electrons;

accelerating the upstream electron beam through a linear accelerator;

removing chirp from the bunches of electrons;

performing a washout of the bunches of electrons, the washout shifting a longitudinal position of electrons in the bunches of electrons proportionally to their energy;

adding chirp to the bunches of electrons;

compressing the bunches of electrons of the upstream electron beam;

directing the upstream electron beam through an undulator to generate coherent radiation; and directing a downstream electron beam, that leaves the undulator, through the linear accelerator to form a decelerated electron beam.

In this way, microbunch instability in the electron beam can be avoided and a higher power output obtained.

BRIEF DESCRIPTION OF THE DRAWINGS

Embodiments of the invention will now be described, by way of example only, with reference to the accompanying schematic drawings, in which:

FIGS. 7A to 7C depict the energy distribution as a function of transverse direction of an electron bunch and energy spread before passing through a transverse field deflecting RF cavity, after passing through a transverse field deflecting RF cavity and after laser heating;

FIG. 8 depicts the processes performed on an electron bunch to generate radiation;

DETAILED DESCRIPTION

Figure 1:
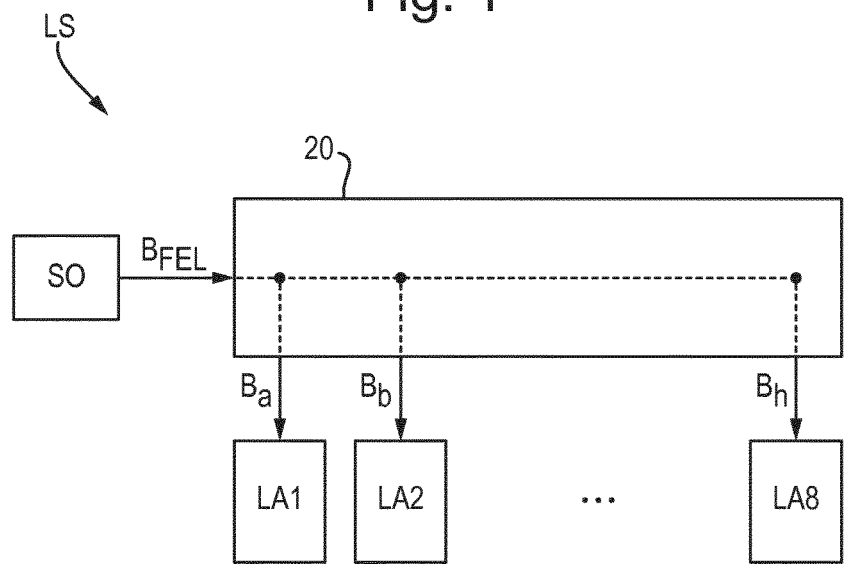
FIG. 1 depicts a lithographic system comprising a free electron laser according to an embodiment of the invention.

FIG. 1 shows a lithographic system LS, comprising: a radiation source SO, a beam splitting apparatus 20 and eight lithographic apparatuses LA1-LA8. The radiation source SO comprises a free electron laser and is configured to generate an extreme ultraviolet (EUV) radiation beam $B_{FEL}$ (which may be referred to as a main beam). The main radiation beam $B_{FEL}$ is split into a plurality of radiation beams $B_a$-$B_h$ (which may be referred to as branch beams), each of which is directed to a different one of the lithographic apparatuses LA1-LA8, by the beam splitting apparatus 20. The branch radiation beams $B_a$-$B_h$ may be split off from the main radiation beam in series, with each branch radiation beam being split off from the main radiation beam downstream from the preceding branch radiation beam. Where this is the case the branch radiation beams may for example propagate substantially parallel to each other.

The radiation source SO, beam splitting apparatus 20 and lithographic apparatuses LA1-LA8 may all be constructed and arranged such that they can be isolated from the external environment. A vacuum may be provided in at least part of the radiation source SO, beam splitting apparatus 20 and lithographic apparatuses LA1-LA8 so as to minimise the absorption of EUV radiation. Different parts of the lithographic system LS may be provided with vacuums at different pressures (i.e. held at different pressures which are below atmospheric pressure).

Figure 2:
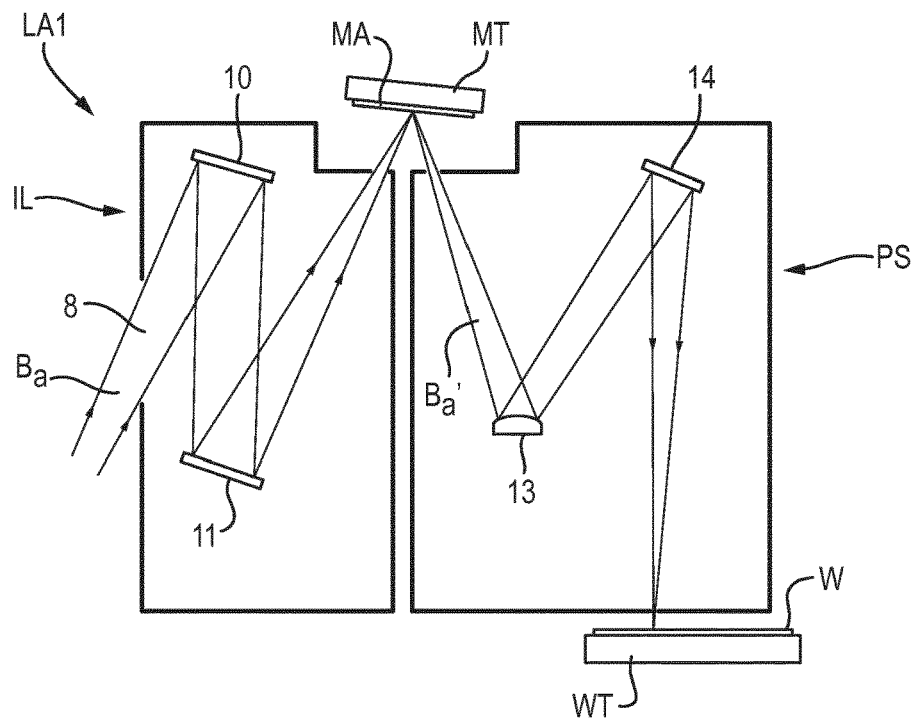
FIG. 2 depicts a lithographic apparatus that forms part of the lithographic system of FIG. 1.

Referring to FIG. 2, a lithographic apparatus LA1 comprises an illumination system IL, a support structure MT configured to support a patterning device MA (e.g. a mask), a projection system PS and a substrate table WT configured to support a substrate W. The illumination system IL is configured to condition the branch radiation beam $B_a$ that is received by that lithographic apparatus LA1 before it is incident upon the patterning device MA. The projection system is configured to project the radiation beam $B_a'$ (now patterned by the mask MA) onto the substrate W. The substrate W may include previously formed patterns. Where this is the case, the lithographic apparatus LA1 aligns the patterned radiation beam $B_a'$ with a pattern previously formed on the substrate W.

While only lithographic apparatuses are shown in FIG. 2, it is to be understood that the lithographic system LS may comprise other tools, such as mask inspection apparatuses.

The branch radiation beam $B_a$ that is received by the lithographic apparatus LA1 passes into the illumination system IL from the beam splitting apparatus 20 through an opening 8 in an enclosing structure of the illumination system IL. Optionally, the branch radiation beam $B_a$ may be focused to form an intermediate focus at or near to the opening 8.

The illumination system IL may include a facetted field mirror device 10 and a facetted pupil mirror device 11. The faceted field mirror device 10 and faceted pupil mirror device 11 together provide the radiation beam $B_a$ with a desired cross-sectional shape and a desired angular distribution. The faceted field mirror device 10 and faceted pupil mirror device 11 may each comprise an array of independently movable mirrors. The faceted field mirror device 10 and faceted pupil mirror device 11 may comprise different numbers of independently movable mirrors. For example the faceted pupil mirror device 11 may comprise twice as many mirrors as the faceted field mirror device 10. The mirrors in the faceted field mirror device 10 and faceted pupil mirror device 11 may be of any suitable shape, for example, they may be generally banana-shaped. The radiation beam $B_a$ passes from the illumination system IL and is incident upon the patterning device MA held by the support structure MT. The patterning device MA reflects and patterns the radiation beam to form a patterned beam $B_a'$. The illumination system IL may include other mirrors or devices in addition to or instead of the faceted field mirror device 10 and faceted pupil mirror device 11. The illumination system IL may for example include an array of independently moveable mirrors. The independently moveable mirrors may for example measure less than 1 mm across. The independently moveable mirrors may for example be MEMS devices.

Following reflection from the patterning device MA the patterned radiation beam $B_a'$ enters the projection system PS. The projection system PS comprises a plurality of mirrors 13, 14 which are configured to project the radiation beam $B_a'$ onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors in FIG. 2, the projection system may include any number of mirrors (e.g. six mirrors).

The radiation source SO comprises a free electron laser FEL according to an embodiment of the present invention, which is operable to produce a beam of EUV radiation. Optionally, the radiation source SO may comprise more than one free electron laser FEL according to an embodiment of the present invention.

The radiation source SO may further comprise optics arranged to alter the size and/or shape of the cross section of the radiation beams received from the free electron laser.

The optics may comprise beam expanding optics arranged to increase the cross sectional area of the radiation beam output by that free electron laser. Advantageously, this decreases the heat load on mirrors downstream of the beam expanding optics. This may allow the mirrors downstream of the beam expanding optics to be of a lower specification, with less cooling, and therefore less expensive. Additionally or alternatively, it may allow the downstream mirrors to be nearer to normal incidence. The beam splitting apparatus 20 may comprise a plurality of static extraction mirrors arranged in the path of the beam $B_{FEL}$ which direct radiation from the main beam $B_{FEL}$ along the plurality of branch radiation beams $B_a$-$B_h$. Increasing the size of the main beam $B_{FEL}$ reduces the accuracy with which the mirrors must be located in the beam $B_{FEL}$ path. Therefore, this allows for more accurate splitting of the output beam $B_{FEL}$ by the splitting apparatus 20.

The radiation source SO may further comprise shape altering optics which are arranged to alter the cross sectional shape of the radiation beams received from the free electron laser. The shape altering optics may comprise one or more astigmatic or a-spherical optical elements. The shape altering optics and beam expanding optics may share common optical elements.

A free electron laser comprises an electron source, which is operable to produce a bunched relativistic electron beam, and a periodic magnetic field through which the bunches of relativistic electrons are directed. The periodic magnetic field is produced by an undulator and causes the electrons to follow an oscillating path about a central axis. As a result of the acceleration caused by the magnetic field the electrons spontaneously radiate electromagnetic radiation generally in the direction of the central axis. The relativistic electrons interact with radiation within the undulator. Under certain conditions, this interaction causes the electrons to bunch together into microbunches, modulated at the wavelength of radiation within the undulator, and coherent emission of radiation along the central axis is stimulated.

Figure 3:
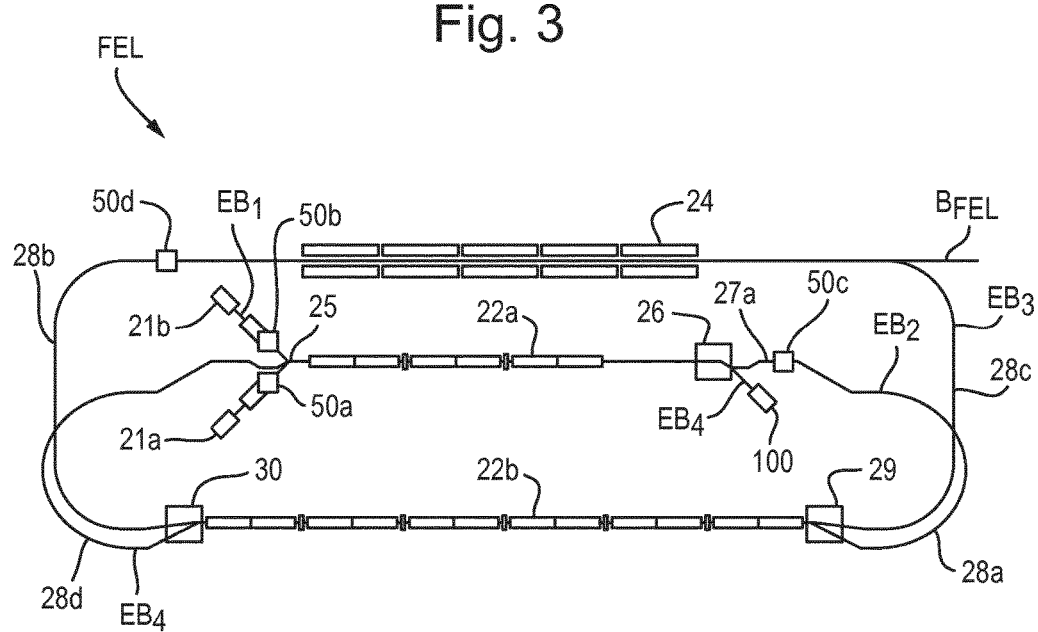
FIG. 3 is a schematic illustration of a free electron laser, which may form part of the lithographic system of FIG. 1.

Referring to FIG. 3, the main components of a free electron laser (FEL) are: injectors 21a, 21b; first and second linear accelerators 22a, 22b; an undulator 24 and a beam dump 100. The injectors 21a, 21b and linear accelerators 22a, 22b are together operable to produce relativistic electrons.

The injectors 21a, 21b are arranged to produce an initial electron beam $EB_1$ having bunches of electrons with a first energy $E_1$. Two injectors are provided for redundancy, so that one can be serviced while the other is in use, and so it is possible to omit one if desired. The injectors 21a, 21b comprises an electron source such as, for example, a thermionic cathode or photo-cathode and an accelerating electric field. Preferably the initial electron beam $EB_1$ has a relatively low emittance, for example below 1 mm mRad. The first energy $E_1$ may be, for example, around 5-20 MeV. The first energy $E_1$ may be around 10-15 MeV, which may be preferable since it may allow the emittance of the initial electron beam $EB_1$ to remain below 1 mm mRad. An electron beam coupler 25, e.g. a dipole magnet system, couples the initial electron beam $EB_1$ into the first linear accelerator 22a.

The initial electron beam $EB_1$ is accelerated by the first linear accelerator 22a to form an accelerated electron beam $EB_2$. In an example, the first linear accelerator 22a may comprise a plurality of resonant cavities, which are axially spaced along a common axis, and one or more radio frequency power sources, which are operable to control the electromagnetic fields along the common axis as bunches of electrons pass between them so as to accelerate each bunch of electrons. The resonant cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Alternatively, the resonant cavities may be conventionally conducting (i.e. not superconducting) radio frequency cavities and may be formed from, for example, copper. Other types of linear accelerators may also be used.

The accelerated electron beam $EB_2$ then passes through a beam diverter 26, whose function will be explained later, and a first chicane 27a which compensates for the effect of beam diverter 26. The accelerated electron beam $EB_2$ then passes through first arc 28a which changes the beam direction by about 180 degrees and delivers the accelerated electron beam $EB_2$ to second linear accelerator 22b. Second linear accelerator 22b may have a similar construction to first linear accelerator 22a and further accelerates accelerated electron beam $EB_2$ to a second, higher energy $E_2$. The free electron laser comprises two linear accelerators in order to make its overall layout more compact. If desired a single longer linear accelerator can be used in place of the first and second linear accelerators 22a, 22b.

The accelerated electron beam $EB_2$ then passes through second arc 28b, which delivers it to the undulator 24. The undulator 24 comprises a plurality of magnets, which are operable to produce a periodic magnetic field and arranged so as to guide the relativistic electrons produced by the injector 21 and linear accelerator 22 along a periodic path. As a result, the electrons radiate electromagnetic radiation generally in the direction of a central axis of the undulator 24. The path followed by the electrons may be sinusoidal and planar, with the electrons periodically traversing the central axis, or may be helical, with the electrons rotating about the central axis. The type of oscillating path may affect the polarization of radiation emitted by the free electron laser. For example, a free electron laser which causes the electrons to propagate along a helical path may produce elliptically polarized radiation, which may be preferred for exposure of a substrate W by the lithographic apparatuses LA1-LA8.

The undulator 24 comprises a plurality of sections, each section comprising a periodic magnet structure. The undulator 24 may further comprise a mechanism for refocusing the accelerated electron beam $EB_2$ such as, for example, a quadrupole magnet in between one or more pairs of adjacent sections. The mechanism for refocusing the accelerated electron beam $EB_2$ may reduce the size of the electron bunches, which may improve the coupling between the electrons and the radiation within the undulator 24, increasing the stimulation of emission of radiation.

As electrons move through the undulator 24, they interact with the electric field of the radiation, exchanging energy with the radiation. In general the amount of energy exchanged between the electrons and the radiation will oscillate rapidly unless conditions are close to a resonance condition, given by:

$$\lambda_{em} = \frac{\lambda_u}{2\gamma^2}\left(1 + \frac{K^2}{A}\right), \tag{1}$$

where $\lambda_{em}$ is the wavelength of the radiation, $\lambda_u$ is the undulator period, $\gamma$ is the Lorentz factor of the electrons and K is the undulator parameter. A is dependent upon the geometry of the undulator 24: for a helical undulator A=1, whereas for a planar undulator A=2. In practice, each bunch of electrons will have a spread of energies although this spread may be minimised as far as possible (by producing an accelerated electron beam $EB_2$ with low emittance). The undulator parameter K is typically approximately 1 and is given by:

$$K = \frac{q\lambda_u B_0}{2\pi mc}, \quad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through the undulator 24. The free electron laser FEL may operate in self-amplified stimulated emission (SASE) mode. Operation in SASE mode may require a low energy spread of the electron bunches in the accelerated electron beam $EB_2$ before it enters the undulator 24. Alternatively, the free electron laser FEL may comprise a seed radiation source, which may be amplified by stimulated emission within the undulator 24.

Electrons moving through the undulator 24 may cause the amplitude of radiation to increase, i.e. the free electron laser FEL may have a non-zero gain. When the resonance condition of Eq. (1) is satisfied, the gain of the free electron laser FEL may be zero. Maximum gain may be achieved when conditions are close to but slightly off resonance.

The interaction between the electrons and radiation within the undulator 24 produces a spread of energies within the electron bunches in the accelerated electron beam $EB_2$. The electron beam $EB_3$ exiting the undulator 24 may be considered to be a different electron beam with a spread of energies and may be referred to as a used electron beam. The energy spread in the used electron beam $EB_3$ is dependent upon the conversion efficiency of the undulator 24. Quantitatively, the width of the energy spread in the used electron beam $EB_3$ may be given by a product of a conversion efficiency of the undulator 24 and the second energy $E_2$.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period $\lambda_u$ may vary along the length of the undulator in order to keep bunches of electrons at or close to resonance as they are guided though the undulator 24. Note that the interaction between the electrons and radiation within the undulator 24 produces a spread of energies within the electron bunches. The tapering of the undulator 24 may be arranged to maximise the number of electrons at or close to resonance. For example, the electron bunches may have an energy distribution which peaks at a peak energy and the tapering maybe arranged to keep electrons with this peak energy at or close to resonance as they are guided though the undulator 24. Advantageously, tapering of the undulator has the capacity to significantly increase conversion efficiency. The use of a tapered undulator may increase the conversion efficiency (i.e. the portion of the energy of the accelerated electron beam $EB_2$ which is converted to radiation in the radiation beam $B_{FEL}$) by more than a factor of 2. The tapering of the undulator may be achieved by reducing the undulator parameter K along its length. This may be achieved by matching the undulator period and/or the magnetic field strength $B_0$ along the axis of the undulator to the electron bunch energy to ensure that they are at or close to the resonance condition. Meeting the resonance condition in this manner increases the bandwidth of the emitted radiation.

A beam of radiation $B_{FEL}$ propagates from the undulator 24. The radiation beam $B_{FEL}$ comprises EUV radiation. The beam of EUV radiation $B_{FEL}$ output by the free electron laser FEL may have a substantially circular cross section and a Gaussian intensity profile. The radiation beam produced by an EUV free electron laser typically has a relatively small etendue. In particular, the EUV radiation beam $B_{FEL}$ produced by the free electron laser FEL has a significantly smaller etendue than an EUV radiation beam that would be generated by a laser produced plasma (LPP) source or a discharge produced plasma (DPP) source (both of which are known in the prior art). For example, the radiation beam $B_{FEL}$ produced by the free electron laser FEL may have a divergence less than 500 μrad, for example less than 100 μrad, and may for example have a diameter of around 50 μm as it leaves the undulator 24.

The output power of the free electron laser FEL may be of the order of tens of kilowatts, in order to support high throughput for the eight EUV lithographic apparatus LA1-LA8. At these powers, since the initial diameter of the radiation beam $B_{FEL}$ produced by the free electron laser FEL is so small, the power density of the radiation beams $B_{a-h}$ will be significant.

In order for the output power of the free electron laser FEL to be sufficient to support high throughput for a plurality of EUV lithographic apparatus LA1-LA8, the free electron laser FEL may have certain properties. For example, the second energy $E_2$ of accelerated electron beam $EB_2$ that is output from second linear accelerator 22b may be around 500 to 1000 MeV. The power of the accelerated electron beam $EB_2$ may be of the order of 1 to 100 MW. The power of the accelerated electron beam $EB_2$ may be dictated by a desired power of the output beam of EUV radiation $B_{FEL}$ and the conversion efficiency of the undulator 24. For a given output power of the free electron laser FEL, the higher the conversion efficiency of the undulator 24 is, the lower the current of the injector 21 will be. Higher undulator conversion efficiencies and lower injector currents may be highly desirable.

The used electron beam $EB_3$ leaving the undulator 24 has to be absorbed by a dump 100. The dump 100 may comprise a sufficient quantity of material to absorb the used electron beam $EB_3$. The material may have a threshold energy for induction of radioactivity. Electrons entering the dump 100 with an energy below the threshold energy may produce only gamma ray showers but will not induce any significant level of radioactivity. The material may have a high threshold energy for induction of radioactivity by electron impact. For example, the beam dump may comprise aluminium (Al), which has a threshold energy of around 17 MeV. It is desirable to reduce the energy of electrons in the used electron beam $EB_3$ before they enter the dump 100. This removes, or at least reduces, the need to remove and dispose of radioactive waste from the dump 100. This is advantageous since the removal of radioactive waste requires the free electron laser FEL to be shut down periodically and the disposal of radioactive waste can be costly and can have serious environmental implications.

Before entering the dump 100, energy is extracted from the used electron beam $EB_3$ i.e. the electrons are decelerated. The energy of the electrons may be reduced to below 10 MeV and, preferably, below 5 MeV. Advantageously, electrons below this energy do not induce any significant level of radioactivity in the beam dump 100. During operation of the free electron laser FEL, gamma radiation will be present but when the electron beam E is switched off, the beam dump 100 will be safe to handle.

The electrons leaving the undulator 24 are decelerated using the first and second linear accelerators 22a, 22b. That is, the first and second linear accelerators 22a, 22b that are used to accelerate electrons output from the injector 21 may also be used for deceleration. Such an arrangement is known as an energy recovering LINAC (ERL).

The electron bunches that leave the undulator 24 pass through third arc 28c which brings them to the second linear accelerator 22b with a phase difference of around 180 degrees relative to the radio frequency (RF) field in the second linear accelerator 22b. A combiner 29 combines the used electron beam $EB_3$ with the accelerated electron beam $EB_2$. The used electron beam $EB_3$ is decelerated in the second linear accelerator 22b to form decelerated electron beam $EB_4$.

At the exit of second linear accelerator 22b it is necessary to separate the accelerated electron beam $EB_2$ from the decelerated electron beam $EB_4$. The accelerated electron beam $EB_2$ and the decelerated electron beam $EB_4$ propagate through the second linear accelerator 22b along the same path. A spreader 30 separates the accelerated electron beam $EB_2$ and the decelerated electron beam $EB_4$. The accelerated electron beam $EB_2$ proceeds to second arc 28b whilst the decelerated electron beam $EB_4$ passes through fourth arc 28d to combiner 25 (mentioned above). Combiner 25 combines the decelerated electron beam $EB_4$ with the bunched electron beam $EB_1$ and enters them into the first linear accelerator 22a, with the decelerated electron beam $EB_4$ having a phase difference of around 180 degrees relative to the radio frequency (RF) field in the first linear accelerator 22a. The first linear accelerator 22a therefore further decelerates the decelerated electron beam $EB_4$ by the same mechanism as the second linear accelerator.

At the exit of the first linear accelerator 22a, the decelerated electron beam $EB_4$ is separated from the accelerated electron beam $EB_2$ using a dipole separator 26 so that the decelerated electron beam can be sent to the dump 100 and the accelerated beam $EB_2$ passes to the second linear accelerator via first arc 28a. A dipole separator simply applies a uniform magnetic field across the beam path causing the accelerated and decelerated electron beams to bend. The degree of deflection to the electron beams caused by the dipole separator 26 is dependent upon the energies of the electrons in the respective beams. Thus the accelerated electron beam $EB_2$ is deflected by only a small amount, whilst the decelerated electron beam is deflected by a greater angle and so is soon physically separate from the accelerated electron beam $EB_2$ and can then be further steered into the dump 100 without affecting the accelerated electron beam $EB_2$. Alternatively an achromatic beam separator (also known as an Enge or Pretzel magnet) can be used to separate the decelerated electron beam $EB_4$ from the accelerated electron beam $EB_2$.

The "life" of an electron bunch may therefore be summarised as follows: it is created in one of the injectors 21a, 21b; accelerated by first linear accelerator 22a and again by second linear accelerator 22b; generates radiation in undulator 24; is decelerated by second linear accelerator 22b and again by first linear accelerator 22a; and finally is absorbed in dump 100. In the above, a description of items such as chicanes and stairs that are used to connect parts of the beam path has been omitted for the sake of brevity. An electron beam propagating through the FEL is referred to herein as the upstream electron beam up to and including the undulator and as the downstream electron beam thereafter.

A significant factor in the power of the beam of radiation $B_{FEL}$ produced by undulator 24 is the slice energy spread (i.e. the spread of energy of the electrons within a slice of the electron bunch perpendicular to the direction of propagation) of the electron bunches that enter the undulator 24. Variation of energy along the direction of propagation also needs to be controlled. A smaller energy spread, i.e. a narrower range of energies in the electron bunches, provides a higher output power. Therefore, it is desirable to provide a low energy spread in the electron bunches produced by injectors 21a, 21b that are then accelerated in the linear accelerators 22a, 22b. In addition, it is desirable to further compress the electron bunches as they progress around the beam path. In an embodiment arcs 28a and 28b have a compressive effect.

However, if the electron bunches have too low an initial energy spread, a phenomenon known as microbunching instability can occur in a device having a compressive effect, e.g. by making higher energy electrons take a longer path than lower electrons. Microbunching instability is a self-amplifying process that greatly increases the energy spread. Any localised increase in the density of electrons in a bunch causes electrons ahead of the increased density region to be pushed ahead (accelerated) whilst electrons behind the localised increase in density are pushed back (decelerated). The effect is to convert density inhomogeneities to energy inhomogeneities and vice versa.

Figure 4:
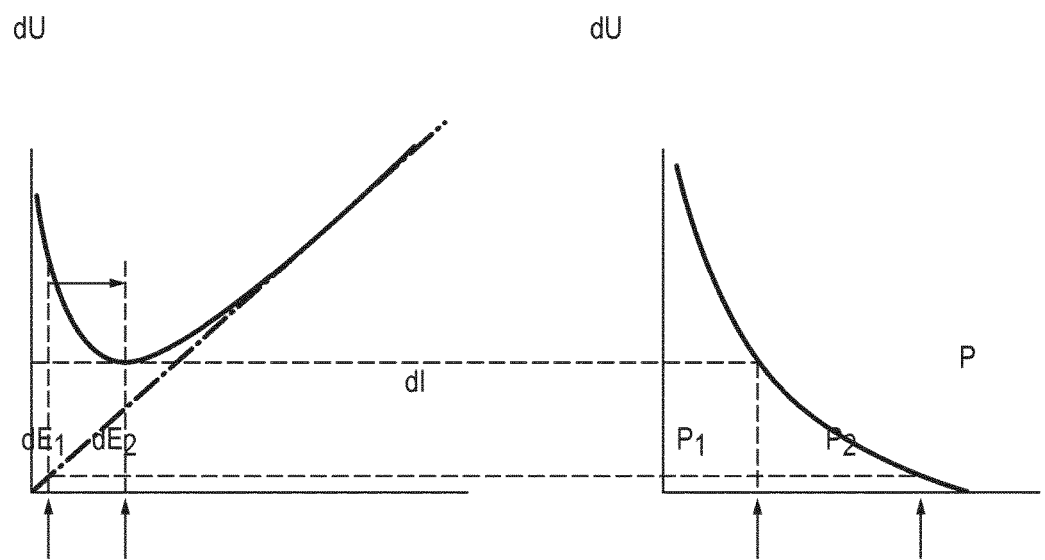
FIG. 4 depicts the relationship between slice energy spread in electron bunches and output power of a free electron laser.

FIG. 4 depicts in the left graph the relationship between initial energy spread dI and energy spread at the undulator dU and in the right graph the relationship between energy spread at the undulator dU and output power of the FEL, P. In the absence of microbunching instability, there would be a monotonic relationship between initial energy spread dI and energy spread at the undulator dU. However, microbunching instability is an unavoidable phenomenon and results instead in a relationship between initial energy spread dI and energy spread at the undulator dU which tends towards the linear relationship at higher energy spreads but at low energy spreads lower initial energy spread gives rise to higher energy spread at the undulator. This is indicated by the solid curve in the left graph of FIG. 4. Thus, in the absence of microbunching instability, a low initial energy spread $dE_1$ would be expected to lead to a high output power $P_2$. However, due to the microbunching instability this low initial energy spread $dE_1$ gives rise to a low output power and in practice the highest achievable output power $P_1$ is obtained with a higher initial energy spread $dE_2$.

Therefore, it has been proposed (Huang et al., Phys. Rev. STAB 7, 074401 (2004)) to deliberately increase the energy spread of the electron bunches to the value which achieves maximum output power by using a so-called laser heater. The laser heater consists of a small secondary undulator section combined with an optical laser beam copropagating with the electron bunches. The combined action of the laser and the undulator field on the electron bunch results in an increase of the energy spread of the electron bunch. Although this approach increases the practically achievable output power of the free electron laser, there is still a substantial reduction in output power compared to the case in the event that bunches having a much lower energy spread could be input to the undulator 24.

A similar problem occurs in free electron lasers used for physics research. It has been proposed (Behrens et al., Phys. Rev. STAB 15, 022802 (2012)) to use two transverse deflecting radio-frequency cavities upstream and downstream of a magnetic bunch compressor chicane. The first transverse deflecting radiofrequency cavity introduces a reversible energy spread which can then be removed by the second transverse deflecting radio-frequency cavity. In this way, microbunching instability is avoided whilst still achieving a narrow energy spread in the bunches of electrons delivered to an undulator. However, the proposed arrangement places the fast transverse deflecting radiofrequency cavities in the middle of a series of linear accelerator sections. Such an arrangement cannot be implemented in an energy recovering linear accelerator in which both accelerating and decelerating electron beams copropagate through the linear accelerator.

Accordingly, an embodiment of the present invention provides a free electron laser comprising: an electron source operable to produce an upstream electron beam comprising bunches of electrons; a beam path configured to direct the upstream electron beam through: a linear accelerator system, a bunch compressor, and an undulator so as to generate coherent radiation; to recirculate a downstream beam that leaves the undulator through the linear accelerator in parallel with the upstream electron beam with a phase such that the downstream beam is decelerated by the linear accelerator; and to direct the downstream beam to a beam dump; a first energy spreader operable to impart a reversible change to the energy distribution of bunches of electrons and located at a position in the beam path before the bunch compressor so that it is only passed through by the upstream electron beam; and a second energy spreader operable to reverse the change to the energy distribution of bunches of electrons imparted by the first beam spreader, the second beam spreader being located at a position in the beam path before the undulator so that it is only passed through by the upstream electron beam.

By positioning the first energy spreader at an early position on the beam path before the bunch compressor so that it is only passed through by the upstream electron beam, prior to acceleration thereof, and the second energy spreader before the undulator so that it too is only passed through by the upstream electron beam, it is possible to introduce a reversible energy spread to avoid microbunching instability in the beam compressor and then remove it before bunches of electrons are delivered to the undulator so as to increase output power. In an embodiment of the present invention, an increase in output power by a factor of about 2 or more can be achieved.

In an embodiment, the second energy spreader is located directly before the undulator, e.g. between the last arc before the undulator and the undulator itself.

In an embodiment, arcs that convey the upstream and downstream electron beams between sections of the linear accelerator and from the linear accelerator to the undulator are configured to act as the bunch compressor.

In an embodiment of the present invention, the linear accelerator system comprises a first linear accelerator and a second linear accelerator so that the upstream electron beam passes through the first linear accelerator before the second linear accelerator and the downstream beam passes through the second linear accelerator before the first linear accelerator. In such an arrangement, the first energy spreader can be located between the first linear accelerator and the second linear accelerator. The first energy spreader can be located after a separator that diverts the downstream beam to a beam dump.

In an embodiment, the beam path is configured to direct the upstream electron beam through each of the first and second linear accelerators more than once before the undulator and to direct the downstream electron beam through each of the first and second linear accelerators more than once before the beam dump. In this arrangement, the first energy spreader is desirably located directly after the electron source, before the first linear accelerator.

In an embodiment, each of the first and second energy spreaders comprises a transverse deflecting radiofrequency (RF) cavity. In an embodiment, each transverse deflecting RF cavity is configured so that bunches of electrons pass through the transverse deflecting RF cavity at a time when the magnetic field therein is at a minimum, desirably zero. With such a timing, the transverse deflecting RF cavity does not deflect the upstream electron beam but the electrons propagating therethrough experience an electric field parallel to the direction of propagation that varies in a direction perpendicular to the direction of propagation. Therefore, an energy spread that is correlated with position of electrons in the bunch is imparted to the electron bunch. This energy spread can therefore be removed by imparting an opposite energy spread.

In an embodiment, at least one of the first and second energy spreaders is further operable in a deflection mode in which bunches of electrons are deflected to a diagnostic beam path. In this way, it is possible to selectively direct electron bunches to a diagnostic beam path without requiring additional hardware. In particular, a transverse deflecting RF cavity as the energy spreader can be controlled to operate in deflection mode rather than energy spreading mode by suitable control of the phase of the RF field relative to the electron bunches of the bunched electron beam.

As shown in FIG. 3, the first energy spreaders, which introduce a reversible energy spread to the bunches of electrons, can be located directly after injectors 21a, 21b, before the initial electron beam $EB_1$ is combined by combiner 25 with decelerated electron beam $EB_4$. For the first energy spreader in this location, one energy spreader is required for each injector 21 but the energy spreader is not a particularly expensive piece of hardware. Alternatively, or in addition, a first energy spreader 50c can be positioned after first linear accelerator 22a and beam separator 26 which diverts the decelerated electron beam $EB_4$ to beam dump 100. In both locations, the first energy spreader is before first arc 28a, which may be configured to compress bunches of electrons.

In the configuration shown in FIG. 3, second energy spreader 50d, which removes the reversible energy spread introduced by first energy spreader 50a, 50b or 50c, can be located before undulator 24. In particular, second energy spreader 50d may be located between arc 28b, which is the last arc before undulator 24, and undulator 24. Arc 28b can be configured to effect bunch compression.

Figure 5:
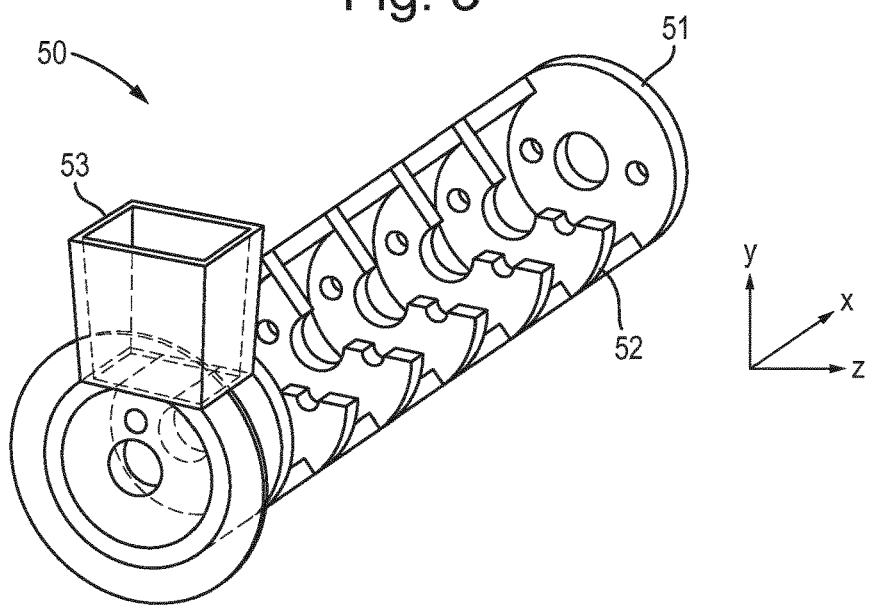
FIG. 5 is a partly cutaway schematic illustration of a transverse deflecting RF cavity.

A transverse deflecting RF cavity 50 that is usable as either a first energy spreader or a second energy spreader in an embodiment of the invention is depicted in FIG. 5. The transverse deflecting RF cavity comprises a cavity 51 surrounding the beam path and divided by a number of irises 52. Each iris has a central aperture for the beam path and may have additional apertures for mode stabilisation. An RF source, e.g. a klystron, generates radiofrequency waves (RF radiation) of appropriate frequency. The radiofrequency waves are fed into the transverse deflecting RF cavity 51 via a waveguide 53. Waveguide 53 may be located at either the upstream or downstream end of cavity 51. A phase controller (not shown) controls the phase of the RF radiation relative to bonds in the electron beam or vice versa.

Figure 6:
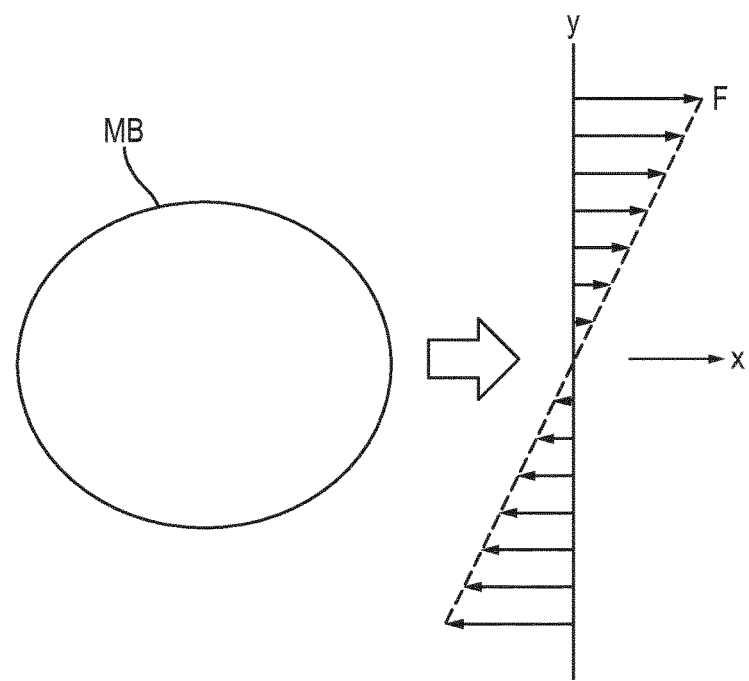
FIG. 6 depicts the relationship between an electron bunch and the transverse electric field in the transverse deflecting RF cavity of FIG. 5 at t=0.

The RF radiation fed into cavity 51 establishes a travelling electromagnetic wave arranged so that the magnetic field is perpendicular to the direction of propagation of electrons through the cavity. In a deflecting mode, electron bunches pass through the cavity 51 at a time when the magnetic field is at a maximum and therefore experience a sideways deflection. In energy spreading mode, the electron bunches pass through the cavity 51 at a time when the transverse magnetic field is at a minimum, e.g. zero. At this time, a transverse electric field F is present in the cavity and increases in magnitude in the direction y which is perpendicular to the direction x of propagation of the electron bunches. This is depicted in FIG. 6 which also shows the relationship between the electric field F and electron bunch MB.

Other designs of transverse deflecting RF cavity, including ones which use a standing wave rather than a travelling wave, can be used in an embodiment of the invention.

The effect of this is shown in FIGS. 7a, 7b and 7c. FIG. 7a depicts the distribution of energy E of electrons in a bunch as a function of position y in a direction perpendicular to the direction of propagation of the beam. The energies of the electrons in a bunch output by injector 21 are distributed across a certain range $dE_1$, which is desirably as small as possible. FIG. 7b depicts the effect of the transverse deflecting RF cavity which imparts an acceleration or deceleration to the electrons that is dependent on their y position. In this example, electrons having a negative y value (i.e. below the bunch centre) are accelerated by an amount dependent on their distance from the bunch centre, whilst electrons having a positive y value (i.e. above the bunch centre) are decelerated by an amount dependent on their distance from the bunch centre. The effect of this, depicted in FIG. 7b, is that the initial energy spread is stretched and rotated. This creates an effective range of energy values $dE_2$ which is greater than $dE_1$ and therefore is more resistant to microbunching instability. FIG. 7c shows by way of comparison the effect of increasing the energy spread of a bunch using a laser heater. Energy is introduced randomly to electrons in the bunch and therefore the energy distribution expands with no correlation to position. It is therefore not possible to reverse the energy spreading. With the energy spread introduced by the transverse deflecting RF cavity, energy is correlated to position and therefore the effect can be reversed.

FIG. 8 depicts schematically the process of an embodiment of the present invention. Electron bunches are generated by injector 21 and then subjected to reversible energy spreading by one of first energy spreaders 50a, 50b or 50c. The electron bunches having had their energy distribution spread are accelerated by linear accelerator 22 and subjected to bunch compression. Bunch compression can be effected, for example, by arcs that transport the electron bunches between sections of the linear accelerator or by elements such as chicanes specifically provided for bunch compression. The electron bunches that have been subjected to the reversible energy spreading do not experience microbunching instability to the same extent as electron bunches with a smaller energy spread because the self-amplification of inhomogeneities is reduced. Electrons ahead of a local density concentration have a range of energies and so when subjected to compression they fall back to a range of longitudinal positions in the electron bunch and so the density concentration is not amplified.

After compression the accelerated electron bunches are subjected to reverse energy spreading by second energy spreader 50d. This applies an electric field that is opposite to the electric field applied by the first energy spreader and therefore reverses the energy spread effect. The magnitude and/or gradient of the electric field applied by the second energy spreader may be different from that applied by the first energy spreader in order to have an effect of the same magnitude as the first energy spreader because of any changes in the transverse size of the electron bunches. It is noted that the second energy spreader need not exactly cancel out the effect of the first energy spreader provided that the energy spread of the electron bunches is reduced. The electron bunches having had the energy spread removed are then fed to undulator 24. Because the electron bunches entering undulator 24 have a narrow range of energies, the output power is high.

In an embodiment of the present invention, at least one of first energy spreaders 50a, 50b or 50c and second energy spreader 50d is operable in a diagnostic mode to direct bunches of electrons into a diagnostic beam line. In an embodiment each of the first and second energy spreaders is operable in such a diagnostic mode. A separate diagnostic beam line may be provided at each of the energy spreaders. The diagnostic beam line may include diagnostic instruments that measure one or more properties of electron bunches, e.g. their timing, energy, energy distribution, spatial distribution, etc.

If a transverse deflecting RF cavity is used as an energy spreader, the cavity can be operated in the diagnostic mode by altering the phase of the RF radiation in the cavity relative to bunches of electrons in the beam. For example, if the phase of the RF radiation is varied so that the magnetic field is at a maximum at the time, an electron bunch propagates through the apparatus then the electrons in the electron bunches will experience a transverse deflection on passing through the transverse deflecting RF cavity and so can be directed to the diagnostic beam line. The diagnostic mode of the energy spreaders can be used when the whole free electron laser is being operated in the diagnostic mode. In the diagnostic mode the energy spreader can be configured to deflect all bunches to the diagnostic beam line or a desired proportion of bunches passing through it.

Figure 9:
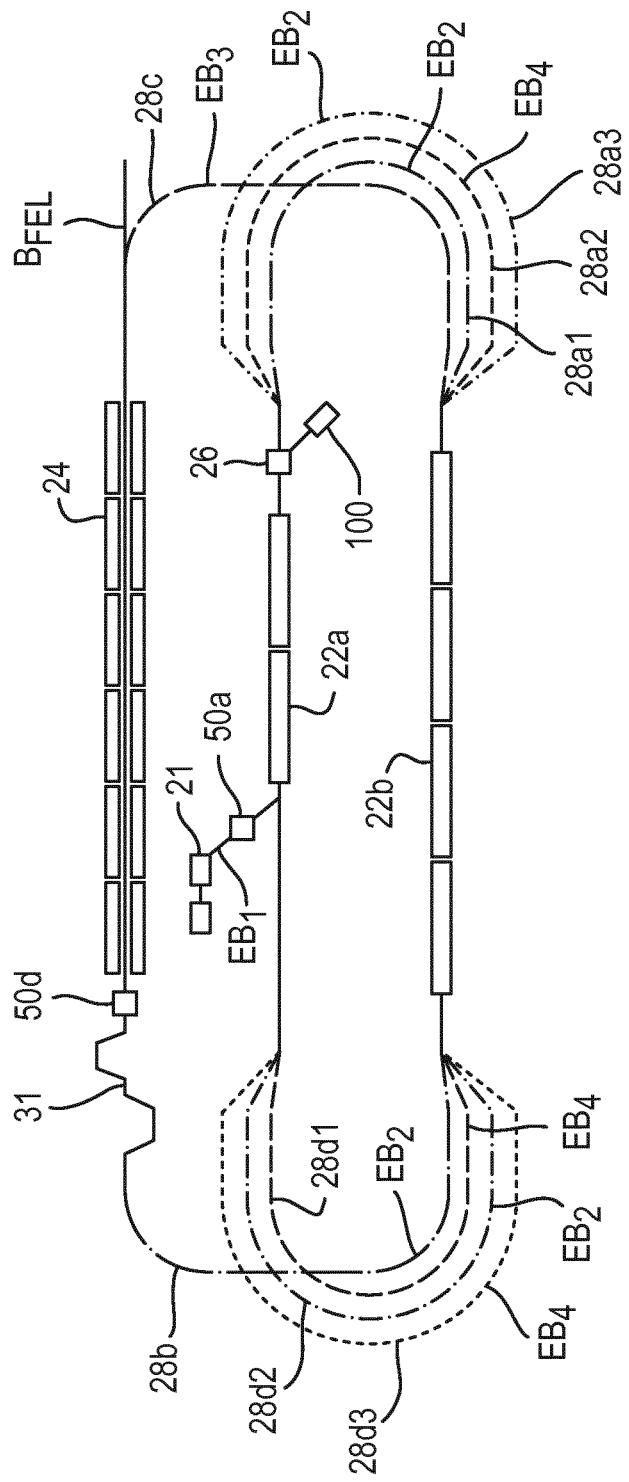
FIG. 9 is a schematic illustration of another free electron laser, which may form part of the lithographic system of FIG. 1.

FIG. 9 depicts another free electron laser according to an embodiment of the present invention. The free electron laser of FIG. 9 is similar to that of FIG. 3 in that it uses the linear accelerators to recover energy from the used electron beam $EB_3$ and divides the linear accelerator system into two separate linear accelerators 22a, 22b. However, the free electron laser of FIG. 9 differs from that of FIG. 3 in that the accelerated electron beam $EB_2$ and decelerated electron beam $EB_4$ are each passed through the linear accelerators 22a, 22b multiple times, e.g. twice. Sending the electron bunches through the linear accelerators 22a, 22b multiple times allows them to be accelerated to higher energies using shorter linear accelerators. Because electron bunches passing between the first and second linear accelerators 22a, 22b at different stages in their acceleration and deceleration will have different energies, it is necessary to provide multiple beam paths linking first and second linear accelerators 22a, 22b to accommodate the beams of different energies.

The free electron laser of FIG. 9 is adapted to pass electron bunches through first and second linear accelerators 22a, 22b twice each in acceleration and deceleration. Therefore, first arc 28a is divided into three separate beam lines 28a1, 28a2 and 28a3 to accommodate electrons of different energies. Likewise, third arc 28d is divided into three beam lines 28d1, 28d2 and 28d3. FIG. 9 depicts beam lines 28a1, 28a2 and 28a3 and beam lines 28d1, 28d2 and 28d3 as spaced apart horizontally and having different radii of curvature. However, these beam lines may have the same radii of curvature and may be stacked vertically rather than spaced apart horizontally.

In the free electron laser of FIG. 9, a first energy spreader 50a is provided directly after injector 21, before the electron bunches generated by injector 21 are combined with recirculating accelerating and decelerating electron bunches and entered into first linear accelerator 22a. First energy spreader 50a introduces a reversible spreading into the energy distribution of electron bunches in the same manner as described above. A second energy spreader 50d is positioned in the beam path immediately before undulator 24. Second energy spreader 50d is operable to remove the reversible energy spread introduced by first energy spreader 50a as described above. Second energy spreader 50d can be provided directly after a chicane 31 which is configured as a bunch compressor. Chicane 31 can be omitted if arcs are configured to act as compressors.

It will be appreciated that other arrangements of a free electron laser are possible and different positions of the first and second energy spreaders may be appropriate in different arrangements of the free electron laser.

As indicated above, microbunch instability can be suppressed by artificially increasing the energy spread of the bunch. However, this conflicts with the requirement to have as low as possible energy spread at the entrance of the undulator. Accordingly the invention also provides an alternative technique to suppress microbunch instability while avoiding the need to increase the initial energy spread.

The microbunch instability process involves the self-amplified development of fluctuations of both the electron density and the electron energy as a function of position along the bunch. Through mutual interaction of electrons in the bunch, such as charge repulsion, density fluctuations drive the growth of energy fluctuations. Bunch compressors in accelerators drive the opposite process and convert energy fluctuations into density fluctuations. The combination of both mechanisms leads to a positive feedback loop in which both density and energy fluctuations are amplified. As a result the energy spread of each bunch slice is increased, impacting the performance of the FEL.

In this embodiment, the microbunch instability process is suppressed by inserting a dedicated "washout" step to smear out the density and energy fluctuations over the length of the bunch. The washout step moves each electron of the bunch along the z direction, over a distance that is proportional to the energy of the electron. The action of the washout step is illustrated with reference to FIGS. 10A to C and 11A to C.

Figure 10A:
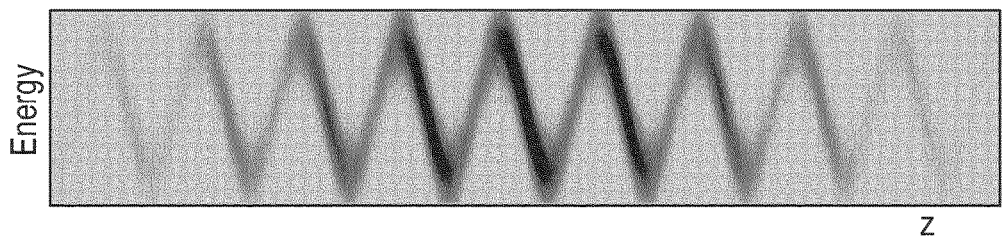
FIGS. 10A to 10C depict the distribution of electrons in a bunch across energy and space before a washout step.
Figure 10B:
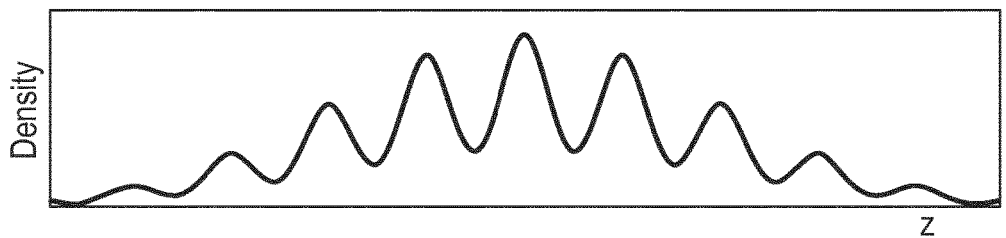
Figure 10C:
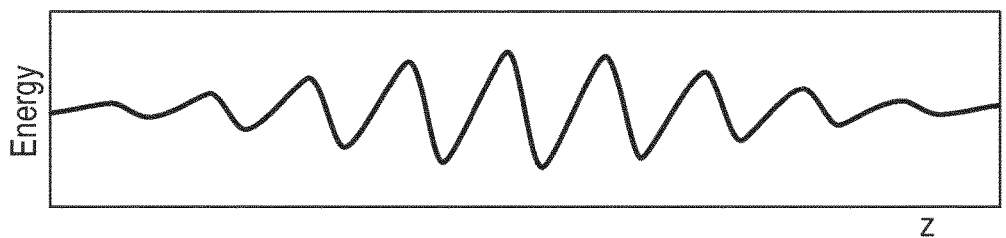
Figure 11A:
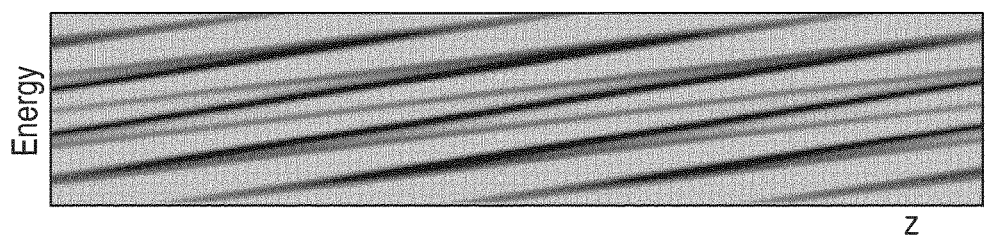
FIGS. 11A to 11C depict the distribution of electrons in a bunch across energy and space after a washout step.
Figure 11B:
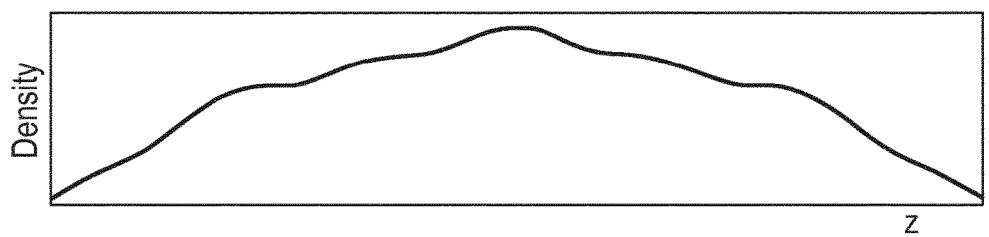
Figure 11C:
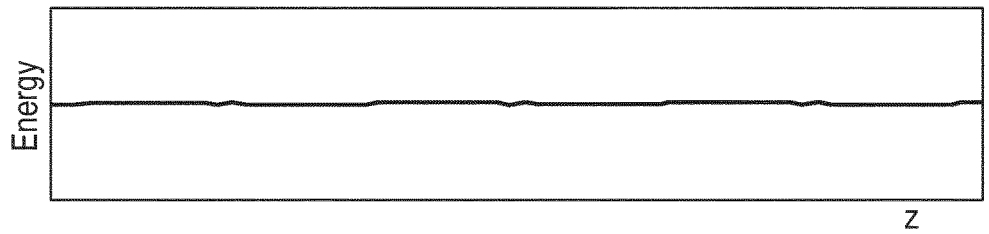

FIG. 10A shows the density of electrons in the energy-position parameter space ("longitudinal phase space"). FIG. 11A shows the same phase space after application of the washout step, in which z translation is applied to the electrons proportional to their individual energy. FIGS. 10B, 10C and 11B, 11C show the corresponding electron energy and density profiles before and after the washout step. FIGS. 10B and 11B are projections of FIGS. 10A and 11A onto the z axis, showing the electron density as function of z. FIGS. 10C and 11C are vertical averages of FIGS. 10A and 11A, showing the average energy as function of z. Clearly, a washout step with sufficient amplitude completely smears out the original density fluctuations that would otherwise be prone to amplification by the microbunch instability process. Following the washout step, bunch compression can be done safely with little microbunch instability amplification.

Various elementary accelerator segments, such as chicanes, zigzags, arcs and doglegs, can be configured to effect a z-translation proportional to energy. The usual measure for the amplitude of this effect is the so-called $R_{56}$ parameter of the accelerator segment. A washout step of this invention can be done by configuring an accelerator segment to have a large $R_{56}$ parameter. In charged particle optics, the position and velocity of individual particles in a particle bunch are usually expressed by six coordinates, corresponding to three dimensions with one position measure and one velocity measure per dimension. The effect that a particular accelerator section has on the six coordinates of the particle when the particle passes the section, is often described in a linear approximation. For example, the position in the propagation direction z of a particle at exit of the accelerator section may be $$z = R_{55} * z_0 + R_{56} * \text{delta}_0,$$

where $z_0$ is the position in the propagation direction of the particle at entrance of the accelerator section, and $\text{delta}_0$ is the relative energy offset of the particle with respect to the average energy of the bunch, i.e.

$$\text{delta}_0 = (E_0 - \langle E \rangle) / \langle E \rangle.$$

The proportionality constants $R_{55}$ and $R_{56}$ above are properties of the accelerator section, and are called the matrix elements of the section. In total there are 36 of them, and are usually encoded as $R_{xy}$, with x and y numbers ranging from 1 to 6. Thus the $R_{56}$ parameter (referred to herein as just $R_{56}$) is thus the proportionality constant between the $\text{delta}_0$ of the particle at entrance of the section and the z of the particle at exit of the section.

It is known to use accelerator parts with large $R_{56}$ to compress a bunch of electrons. This is done by accelerating the front of the bunch somewhat more than the back of the bunch (known as "adding chirp to the bunch") after which the effect of the accelerator part with large $R_{56}$ is to move the back and the front of the bunch closer together. In the present invention, the washout step is configured to avoid causing bunch compression. It is therefore desirable that the chirp is removed from the bunch prior to the washout step.

Thus a method of this embodiment includes the following steps:
1. Electron source
2. Acceleration
3. Dechirp the bunch
4. Washout step
5. Chirp the bunch
6. Compression stage.

In an FEL accelerator having two steps of acceleration and compression, the above scheme may be applied to either or to both of these steps.

In an embodiment of the invention, the magnitude of the required $R_{56}$ effect can be estimated as follows. The well-known condition for microbunch instability damping is:

$$\exp[-\tfrac{1}{2}(k * R_{56} * (\sigma_E/E))^2] \ll 1, \qquad (3)$$

where $k = 2\pi/\lambda$ with $\lambda$ the typical length of density fluctuations and $\sigma_E/E$ the amplitude of the relative energy spread [Di Mitri et al., Phys. Rev. PRSTAB 13, 010702 (2010)]. Typically in accelerators serving radiation sources, the most problematic microbunch instability occurs for density fluctuations with $\lambda$ less than about 100 μm, inducing energy spread $\sigma_E$ that easily exceeds about 30 keV (=10 times shot noise level of about 3 keV). With these assumptions, and assuming a beam energy E of about 1 GeV, the microbunch instability damping criterion requires an $R_{56}$ of several tens of cm. This magnitude of $R_{56}$ can readily be achieved in magnetic parts such as chicanes. In an embodiment the washout element has an $R_{56}$ in the range of from 0.01 m to 2 m, desirably 0.1 m to 1.0 m.

Microbunch instability suppression based on a washout step using a large $R_{56}$ accelerator segment, in combination with a dechirped bunch, has been proposed and experimentally proven before for the specific case of a linear, non-energy recovering accelerator [Di Mitri et al., Phys. Rev. PRSTAB 13, 010702 (2010); Di Mitri et al., Phys. Rev. Lett. 112, 134802B]. However, the arrangements disclosed therein are not suitable for an energy-recovering linac (ERL).

A high repetition rate ERL imposes specific requirements for implementation of a washout step to suppress microbunch instability. This is because, in part of the ERL, decelerating bunches travel along the same beampipe as the accelerating bunches. However, the washout step is specifically intended to act on the accelerating bunches only. The decelerating bunches, which in general cannot be prepared to have zero chirp, would be aggressively (de)compressed by the washout element if they passed through it as well. Therefore only the accelerating electron bunches should be led through the washout element.

Figure 12:
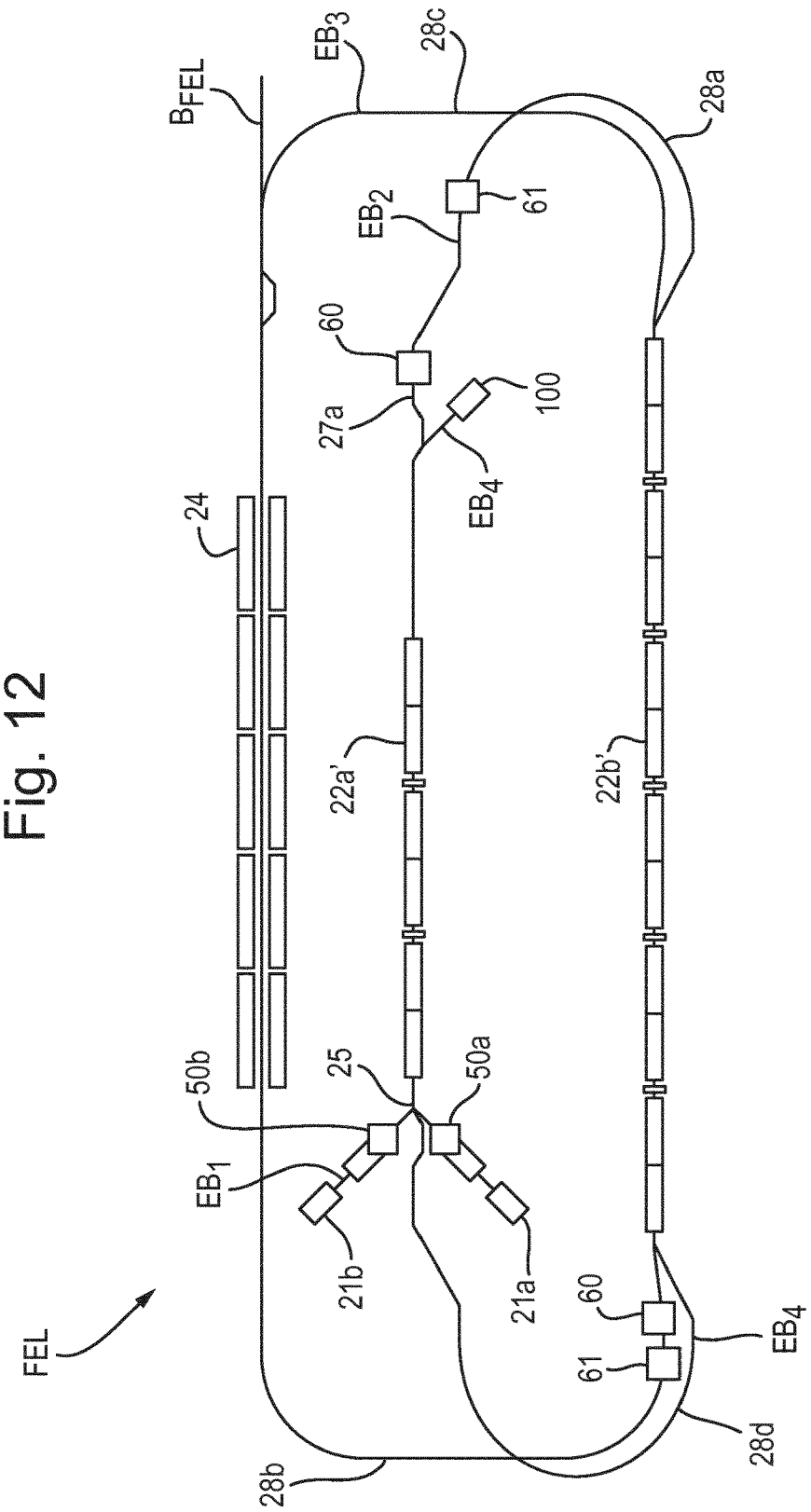
FIG. 12 is a schematic illustration of another free electron laser, which may form part of the lithographic system of FIG. 1.
Figure 13:
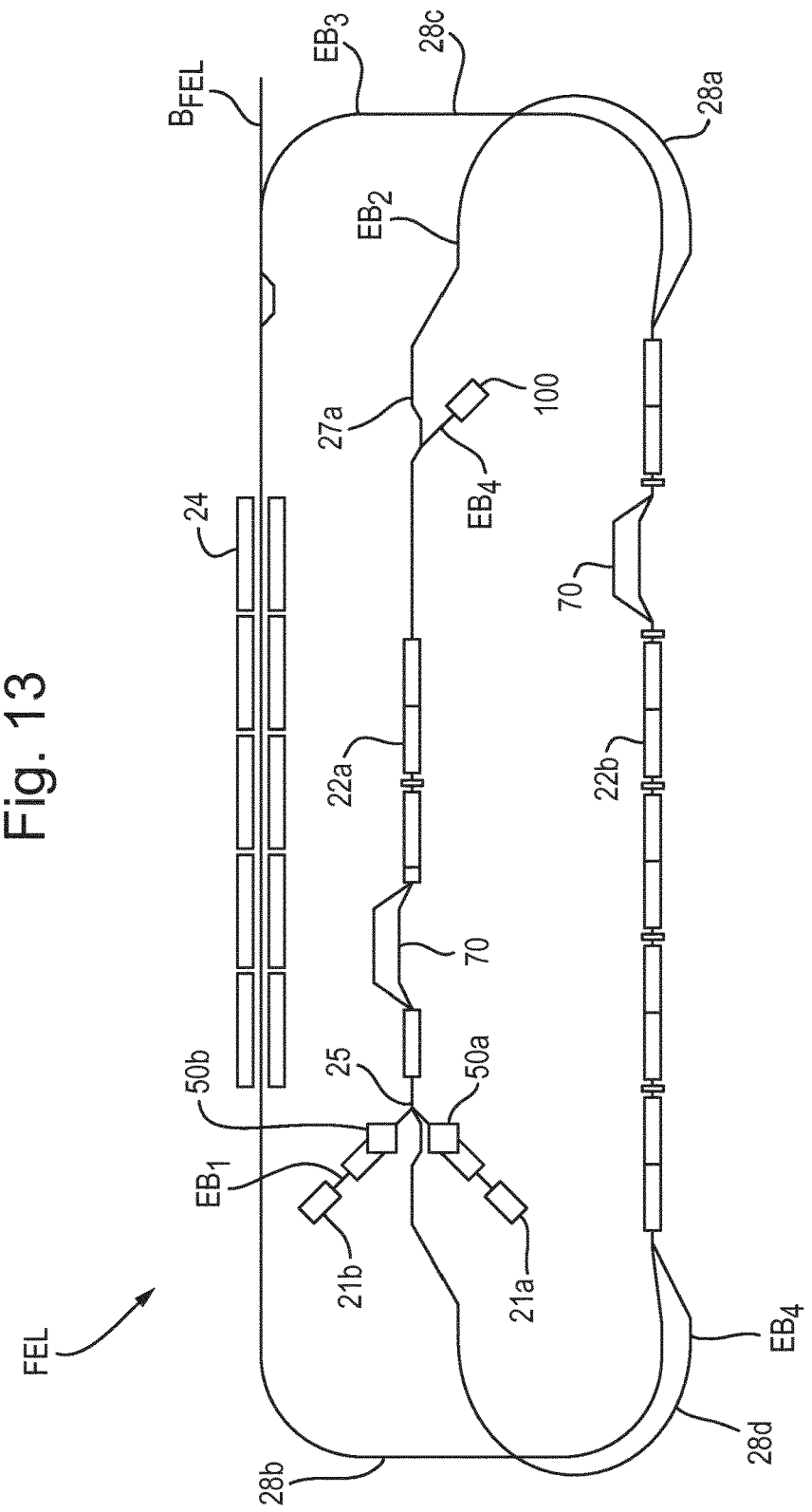
FIG. 13 is a schematic illustration of another free electron laser, which may form part of the lithographic system of FIG. 1.

In FIGS. 12 and 13, two implementation options for washout steps in an ERL are shown. The depicted ERLs are the same as the ERLs described above with reference to FIGS. 3 and 9 so that features that are the same are not described again in the interests of brevity.

The ERLs shown in FIGS. 12 and 13 include two compression and acceleration steps in series, therefore two washout steps are provided. It will be appreciated that the arrangements of FIGS. 12 and 13 can readily be adapted to an ERL of different form. In FIGS. 12 and 13, compression takes place in arcs 28a and 28b, which is where microbunch instability is to be suppressed. In other ERL designs the compression function may be done instead using compression chicanes near the arcs, for example.

In the embodiment of FIG. 12, the first linear accelerator 22a' and second linear accelerator 22b' are configured to set the chirp of the bunches to be zero, but are otherwise the same as the linear accelerators described above. Spreader sections 60 are provided between first linear accelerator 22a' and first arc 28a and between second linear accelerator 22b' and second arc 28b. Spreader sections 60 are tuned to have a very large $R_{56}$, as described above, so that they will function to perform washout step. The spreaders may also fulfil other beam conditioning functions, such as separating the accelerating and decelerating beams. The spreaders 60 in the path of the accelerating bunches only can be configured to provide the required $R_{56}$ so will not affect the decelerating bunches.

Additional RF cavities 61 are provided after the spreaders 60 to add chirp to the bunches so that arcs 28a, 28b can compress the bunches. A higher harmonic cavity (i.e. an RF cavity operating at integer multiple of the linear accelerator frequency) can be used. A 3.9 GHz harmonic cavity module having a footprint of less than 2 m is disclosed in E. Harms et al., Proc. SRF2009, MOOBAU01].

The embodiment of FIG. 12 can achieve the primary aim of suppressing microbunch instability gain in the compression stages. Additionally, the chirp function is moved from the linear accelerator to a dedicated module, increasing the design flexibility and relaxing the requirements for the linear accelerator design. Furthermore, because the linear accelerator is not required to chirp the bunch, the linear accelerator can be operated fully on crest. This provides margin to lower the acceleration gradient by about 10% (improve availability) or decrease the number of accelerating cavities of the linear accelerator by about 10% (decrease cost and length).

Figure 14A:
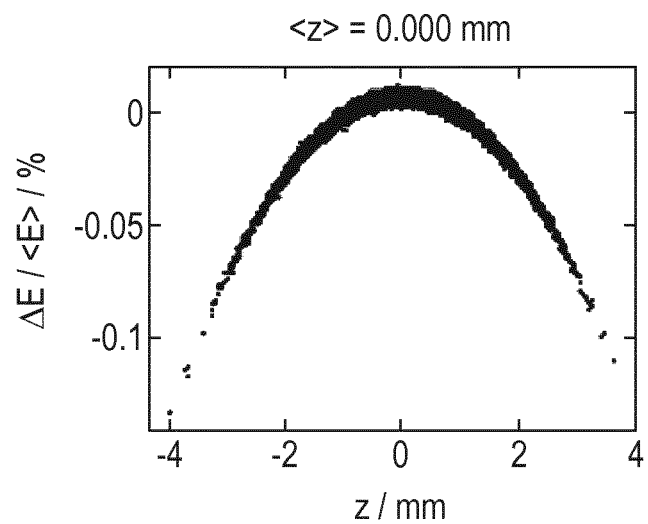
FIGS. 14A and 14B depict the effect of a washout step on bunch shape in energy-z phase space.
Figure 14B:
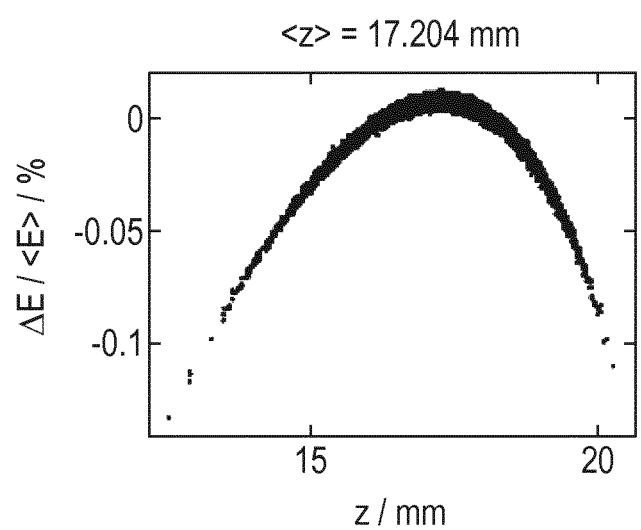

A possible effect of the embodiment of FIG. 12 is that the bunch is accelerated by the linear accelerator in a setup leading to zero chirp, which is known as "on-crest acceleration". For on-crest acceleration the bunch distribution in z-E phase space acquires a relatively large curvature. It is possible that a bunch with large curvature would be heavily distorted when passing through a large $R_{56}$ section such as the washout step. However, although the z translation associated with the washout step is large on the scale of the density fluctuations it is still small on the scale of the bunch length. Because of this, the distortion of the bunch shape by on-crest acceleration and the washout step is very mild. This is shown in FIG. 14, which shows a simulation result of the bunch shape before and after the washout step, taking into account the curvature due to the on-crest acceleration.

Another embodiment of the invention is depicted in FIG. 13. Again, this embodiment is similar to earlier described embodiments, save as noted below, and a description of unchanged parts is omitted for brevity.

In the embodiment of FIG. 13, a short chicane 70 is inserted in one section of each of linear accelerator 22a and linear accelerator 22b. The first magnet of the chicane 70 acts as a spreader which separates the accelerating and decelerating bunches into separate beam pipes. The path of the accelerating bunches is set up to have large $R_{56}$ and thereby chicane 70 is configured to act as the washout module. The path of the decelerating bunch is set up to have small impact on the bunch properties. The part of the linear accelerator upstream of the chicane 70 is tuned to zero the chirp of the accelerating bunches, as required for the washout chicane. The embodiment of FIG. 13 has the benefit that only passive magnetic elements are used, which generally are very reliable and inexpensive. A possible disadvantage is that an additional function is combined into the linear accelerator, which makes the design more restrictive and inflexible.

Thus, the embodiments of FIGS. 12 and 13 can achieve microbunch instability suppression in an ERL by leading a zero-chirp bunch through a large $R_{56}$ "washout" element. Advantageously, microbunch instability washout functionality is integrated into the spreader chicane of an ERL. Furthermore, these embodiments can separate the functions of acceleration and chirp control of an ERL by using a dedicated chirper module in addition to a linear accelerator.

The main advantage of the embodiments of FIGS. 12 and 13 is suppression of microbunch instability gain in compressive parts of an ERL, thereby increasing FEL output power and stability. In addition, the embodiment of FIG. 12 provides advantages that having a dedicated chirper cavity enables linear accelerator operation closer to crest, giving margin to reduce the acceleration gradient and thereby improving linear accelerator lifetime and availability. Alternatively, linear accelerator operation closer to crest gives margin to shorten the linear accelerator, reducing cost and size of the FEL accelerator Although the described embodiment of lithographic system LS comprises eight lithographic apparatuses LA1-LA8, a lithographic system according to an embodiment of the invention may comprise any number of lithographic apparatuses.

A lithographic system according to an embodiment of the invention may further comprise one or more mask inspection apparatuses. The beam splitting apparatus 20 may direct a portion of the main radiation beam $B_{FEL}$ to the mask inspection apparatus. The mask inspection apparatus may use this radiation to illuminate a mask and uses an imaging sensor to monitor radiation reflected from the mask MA. The mask inspection apparatus may include optics (e.g. mirrors) configured to receive a branch radiation beam from beam splitting apparatus 20 and direct the radiation beam at a mask. The mask inspection apparatus may further include optics (e.g. mirrors) configured to collect radiation reflected from the mask and form an image of the mask at the imaging sensor. The mask inspection apparatus may be similar to the lithographic apparatus LA1 shown in FIG. 2, with the substrate table WT replaced with an imaging sensor. In some embodiments, the lithographic system may comprise two mask inspection apparatuses to allow for some redundancy. This may allow one mask inspection apparatus to be used when the other mask inspection apparatus is being repaired or undergoing maintenance. Thus, one mask inspection apparatus is always available for use. A mask inspection apparatus may use a lower power radiation beam than a lithographic apparatus.

The term "EUV radiation" may be considered to encompass electromagnetic radiation having a wavelength within the range of 5-20 nm, for example within the range of 13-14 nm. EUV radiation may have a wavelength of less than 10 nm, for example within the range of 5-10 nm such as 6.7 nm or 6.8 nm. The present invention can also be applied in a free electron laser that is used to generate radiation outside the EUV wavelength range.

The lithographic apparatuses LA1-LA8 may be used in the manufacture of ICs. Alternatively, the lithographic apparatuses LA1-LA8 described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A free electron laser comprising:
an electron source operable to produce an upstream electron beam comprising bunches of electrons;
a beam path configured to:
direct the upstream electron beam through: a linear accelerator system, a bunch compressor, and an undulator so as to generate coherent radiation;
recirculate a downstream beam that leaves the undulator through the linear accelerator system in parallel with the upstream electron beam with a phase such that the downstream beam is decelerated by the linear accelerator system; and
direct the downstream beam to a beam dump;
a first energy spreader operable to impart a reversible change to the energy distribution of bunches of electrons and located at a position in the beam path before the bunch compressor so that it is only passed through by the upstream electron beam; and
a second energy spreader operable to reverse the change to the energy distribution of bunches of electrons imparted by the first beam spreader, the second beam spreader being located at a position in the beam path before the undulator so that it is only passed through by the upstream electron beam.

2. The free electron laser of claim 1, wherein the second energy spreader is located directly before the undulator.

3. The free electron laser of claim 1, wherein the beam path comprises one or more arcs and the arcs are configured to act as the bunch compressor.

4. The free electron laser of claim 1, wherein the linear accelerator system comprises a first linear accelerator and a second linear accelerator arranged in the beam path so that the upstream electron beam passes through the first linear accelerator before the second linear accelerator and the downstream beam passes through the second linear accelerator before the first linear accelerator.

5. The free electron laser of claim 4, wherein the first energy spreader is located between the first and second linear accelerators.

6. The free electron laser of claim 4, wherein the beam path is configured to:
direct the upstream electron beam through each of the first and second linear accelerators more than once before the undulator; and
direct the downstream electron beam through each of the second and first linear accelerators more than once before the beam dump.

7. The free electron laser of claim 1, wherein the first energy spreader is located directly after the electron source.

8. The free electron laser of claim 1, wherein each of the first and second energy spreaders comprise a transverse deflecting RF cavity.

9. The free electron laser of claim 7, wherein each transverse deflecting RF cavity is configured so that bunches of electrons pass through the transverse deflecting RF cavity at a time when the magnetic field therein is at a minimum.

10. The free electron laser of claim 1, wherein at least one of the first and second energy spreaders is further operable in a deflection mode in which it deflects bunches of electrons to a diagnostic beam path.

11. A free electron laser comprising:
an electron source operable to produce an upstream electron beam comprising bunches of electrons;
a beam path configured to:
direct the upstream electron beam through: a linear accelerator system, a bunch compressor, and an undulator so as to generate coherent radiation;
recirculate a downstream beam that leaves the undulator through the linear accelerator system in parallel with the upstream electron beam with a phase such that the downstream beam is decelerated by the linear accelerator system, and
direct the downstream beam to a beam dump; wherein the linear accelerator system is configured to act as a de-chirper that removes chirp from the bunches of electrons of the upstream beam; and
a compressor configured to compress the bunches of electrons.

12. The free electron laser of claim 11, further comprising an RF cavity configured to add chirp to the bunches of electrons of electrons of the upstream beam.

13. The free electron laser of claim 11, wherein the linear accelerator is configured to act as a chirper that adds chirp to the bunches of electrons of electrons of the upstream beam.

14. The free electron laser of claim 11, further comprising a spreader configured to shift a longitudinal position of electrons in the bunches of electrons of the upstream beam proportionally to their energy.

15. The free electron laser of claim 11, further comprising a chicane configured to shift a longitudinal position of electrons in the bunches of electrons of the upstream beam proportionally to their energy.

16. The free electron laser of claim 15, wherein the chicane is situated between sections of the linear accelerator system.

17. The free electron laser of claim 15, wherein the chicane has an $R_{56}$ parameter value in the range of from about 0.01 m to about 2 m.

18. A lithographic system comprising:
a free electron laser comprising:
an electron source operable to produce an upstream electron beam comprising bunches of electrons;
a beam path configured to:
direct the upstream electron beam through: a linear accelerator system, a bunch compressor, and an undulator so as to generate coherent radiation;
recirculate a downstream beam that leaves the undulator through the linear accelerator system in parallel with the upstream electron beam with a phase such that the downstream beam is decelerated by the linear accelerator system; and
direct the downstream beam to a beam dump;
a first energy spreader operable to impart a reversible change to the energy distribution of bunches of electrons and located at a position in the beam path before the bunch compressor so that it is only passed through by the upstream electron beam; and
a second energy spreader operable to reverse the change to the energy distribution of bunches of electrons imparted by the first beam spreader, the second beam spreader being located at a position in the beam path before the undulator so that it is only passed through by the upstream electron beam; and
one or more lithographic apparatuses.

19. A method of producing a radiation beam, comprising:
producing an upstream electron beam comprising bunches of electrons;
accelerating the upstream electron beam through a linear accelerator;
compressing bunches of electrons of the upstream electron beam;
directing the upstream electron beam through an undulator to generate coherent radiation;
directing a downstream electron beam, that leaves the undulator, through the linear accelerator to form a decelerated electron beam;
reversibly spreading the energy of the bunches of electrons of only the upstream electron beam before the compressing; and
reversing the spreading before the undulator.

20. A method of producing a radiation beam, comprising:
producing an upstream electron beam comprising bunches of electrons;
accelerating the upstream electron beam through a linear accelerator;
removing chirp from the bunches of electrons;
performing a washout of the bunches of electrons, the washout shifting a longitudinal position of electrons in the bunches of electrons proportionally to their energy;
adding chirp to the bunches of electrons;
compressing the bunches of electrons of the upstream electron beam;
directing the upstream electron beam through an undulator to generate coherent radiation; and
directing a downstream electron beam, that leaves the undulator, through the linear accelerator to form a decelerated electron beam.

* * * * *